US008493737B2

(12) United States Patent
Abe et al.

(10) Patent No.: US 8,493,737 B2
(45) Date of Patent: Jul. 23, 2013

(54) PRESSING MEMBER, PRESSING STRUCTURE FOR HEAT RECEIVING BLOCK OF SUBSTRATE, AND ELECTRONIC DEVICE

(75) Inventors: Koji Abe, Ome (JP); Takeshi Hongo, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 12/842,895

(22) Filed: Jul. 23, 2010

(65) Prior Publication Data

US 2011/0075370 A1 Mar. 31, 2011

(30) Foreign Application Priority Data

Sep. 30, 2009 (JP) ................................ 2009-228035

(51) Int. Cl.
*H05K 7/20* (2006.01)
*F28F 7/00* (2006.01)

(52) U.S. Cl.
USPC ........... 361/700; 361/702; 361/709; 361/710; 361/711; 361/679.52; 165/104.33

(58) Field of Classification Search
USPC ....... 361/700, 709–711, 702, 679.52–679.54; 165/138, 104.33
See application file for complete search history.

(56) References Cited

U.S. PATENT DOCUMENTS 5,339,214 A * 8/1994 Nelson .......................... 361/695
5,398,748 A * 3/1995 Yamaji et al. ................ 165/80.2
5,549,155 A * 8/1996 Meyer et al. ............. 165/104.33
6,140,571 A * 10/2000 Kitahara et al. ............. 174/16.3
6,226,178 B1 * 5/2001 Broder et al. ............ 361/679.52
6,469,894 B2 * 10/2002 Ubukata ........................ 361/700
6,625,021 B1 * 9/2003 Lofland et al. ................ 361/697
6,781,835 B2 * 8/2004 Hashimoto et al. ........... 361/697
6,900,990 B2 * 5/2005 Tomioka ....................... 361/752

(Continued)

FOREIGN PATENT DOCUMENTS

GB 2293446 A * 3/1996
JP 09191440 A * 7/1997

(Continued)

OTHER PUBLICATIONS

Notice of Rejection mailed by Japan Patent Office on Oct. 26, 2010 in the corresponding Japanese patent application No. 2009-228035.

(Continued)

*Primary Examiner* — Anatoly Vortman
(74) *Attorney, Agent, or Firm* — Knobbe Martens Olson & Bear LLP

(57) ABSTRACT

According to one embodiment, a pressing member includes: a band-like pressing portion placed on a heat receiving block arranged on an element mounted on a substrate, the pressing portion configured to press the heat receiving block against the element; a first arm, one end of the first arm being connected to one longitudinal end of the pressing portion, other end of the first arm being connected to the substrate; and a second arm, one end of the second arm being connected to other longitudinal end of the pressing portion, other end of the second arm being connected to the substrate, wherein the first arm and the second arm are connected to the pressing portion in a bent shape as seen in a planar view from above a surface of the substrate.

18 Claims, 5 Drawing Sheets

U.S. PATENT DOCUMENTS

| | | | | |
|---|---|---|---|---|
| 7,215,548 | B1 * | 5/2007 | Wu et al. | 361/703 |
| 7,477,515 | B2 * | 1/2009 | Tsai et al. | 361/700 |
| 7,508,669 | B2 * | 3/2009 | Fonfara et al. | 361/699 |
| 7,542,293 | B2 * | 6/2009 | Zhao et al. | 361/700 |
| 7,755,897 | B2 * | 7/2010 | Chen et al. | 361/707 |
| 7,835,152 | B2 * | 11/2010 | Wang et al. | 361/710 |
| 7,911,781 | B2 * | 3/2011 | Chao et al. | 361/679.48 |
| 8,098,490 | B2 * | 1/2012 | Hata | 361/700 |
| 2002/0126453 | A1 * | 9/2002 | Ubukata | 361/720 |
| 2003/0183373 | A1 * | 10/2003 | Sarraf et al. | 165/104.33 |
| 2004/0037045 | A1 * | 2/2004 | Phillips et al. | 361/719 |
| 2004/0042184 | A1 * | 3/2004 | Tomioka | 361/752 |
| 2004/0109301 | A1 * | 6/2004 | Shih-Tsung | 361/829 |
| 2004/0123978 | A1 * | 7/2004 | Hashimoto et al. | 165/80.3 |
| 2004/0165350 | A1 * | 8/2004 | Fan | 361/700 |
| 2004/0257770 | A1 * | 12/2004 | Hu | 361/704 |
| 2005/0099776 | A1 * | 5/2005 | Xue et al. | 361/700 |
| 2005/0141202 | A1 * | 6/2005 | Lee et al. | 361/704 |
| 2005/0259405 | A1 * | 11/2005 | He | 361/729 |
| 2006/0181850 | A1 * | 8/2006 | Frank et al. | 361/700 |
| 2006/0232934 | A1 * | 10/2006 | Kusamoto et al. | 361/697 |
| 2009/0103265 | A1 * | 4/2009 | Hongo | 361/697 |
| 2009/0195988 | A1 * | 8/2009 | Hongo | 361/709 |
| 2009/0213550 | A1 * | 8/2009 | Hongo | 361/704 |

FOREIGN PATENT DOCUMENTS

| | | |
|---|---|---|
| JP | 2004-008814 A | 3/2004 |
| JP | 2004-088014 | 3/2004 |
| JP | 2007-034699 A | 2/2007 |
| JP | 2009-064922 A | 3/2009 |
| JP | 2009-076674 | 4/2009 |
| JP | 2009-076674 A | 4/2009 |
| JP | 2009-151367 | 7/2009 |
| JP | 2009-151367 A | 7/2009 |

OTHER PUBLICATIONS

Notice of Rejection mailed by Japan Patent Office on Mar. 8, 2011 in the corresponding Japanese patent application No. 2009-228035.

* cited by examiner

PRESSING MEMBER, PRESSING STRUCTURE FOR HEAT RECEIVING BLOCK OF SUBSTRATE, AND ELECTRONIC DEVICE

CROSS-REFERENCE TO RELATED APPLICATIONS

This application is based upon and claims the benefit of priority from Japanese Patent Application No. 2009-228035, filed on Sep. 30, 2009, the entire contents of which are incorporated herein by reference.

BACKGROUND

1. Field

One embodiment of the invention relates to a pressing member, a pressing structure for a heat receiving block of a substrate, and an electronic device.

2. Description of the Related Art

Conventionally, there is known a structure for dissipating heat, which is generated by an element mounted on a substrate, to the environment through a heat receiving block, a heat pipe, a heat dissipating member, and the like arranged on the element. In this structure, the heat receiving block is pressed against the element by a pressing member formed in linear shape as seen in a planar view from above a surface of the substrate, and arranged over the element. For example, Japanese Patent Application Publication (KOKAI) No. 2004-88014 discloses a conventional technology related to such a structure.

In the conventional technology, since an area of the heat receiving block pressed by the pressing member is less than the entire area of the heat receiving block, there is caused the position dependency of the pressure acting from the heat receiving block on the element. As a result, a contact condition between the heat receiving block and the element varies at different locations, thereby heat dissipation ratio of the element varies at different locations.

In order to avoid the position dependency of the heat dissipation ratio, it may be considered to enlarge (elongate) the area of the heat receiving block pressed by the pressing member. However, as a result of the above, a length of an arm provided between a position of the substrate where the pressing member is attached and the area where the heat receiving block is pressed becomes relatively short. Accordingly, stress caused in the pressing member (particularly in the arm) is locally increased, and as a result, the pressing member undergoes local plastic deformation. This local plastic deformation may increase the position dependency of the pressure acting from the heat receiving block on the element.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
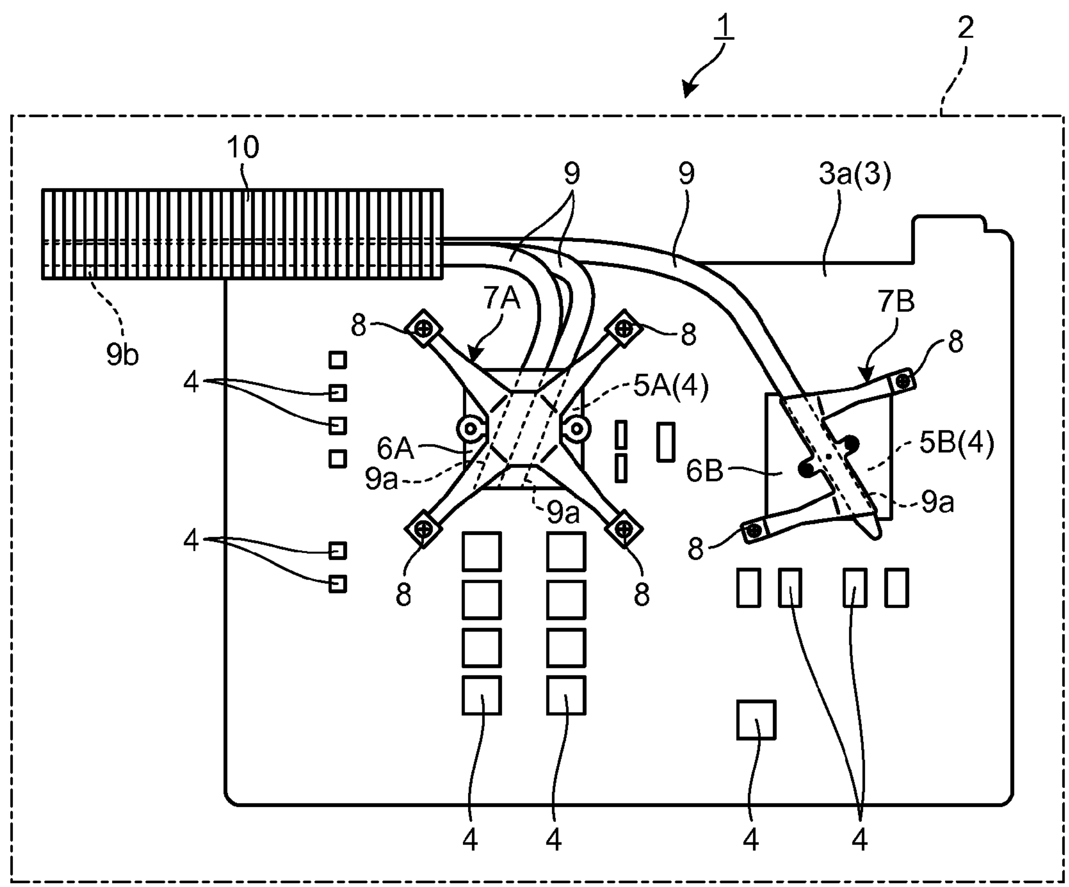
FIG. 1 is an exemplary plan view of an electronic device including a substrate according to an embodiment of the invention.

Various embodiments according to the invention will be described hereinafter with reference to the accompanying drawings. In general, according to one embodiment of the invention, a pressing member comprises: a band-like pressing portion placed on a heat receiving block arranged on an element mounted on a substrate, the pressing portion configured to press the heat receiving block against the element; a first arm, one end of the first arm being connected to one longitudinal end of the pressing portion, other end of the first arm being connected to the substrate; and a second arm, one end of the second arm being connected to other longitudinal end of the pressing portion, other end of the second arm being connected to the substrate, wherein the first arm and the second arm are connected to the pressing portion in a bent shape as seen in a planar view from above a surface of the substrate.

According to another embodiment of the invention, an electronic device, comprises: a body; a heat dissipating member housed in the body; a circuit substrate housed in the body and on which a heat generating body is mounted; a heat transferring member comprising a first end and a second end opposing to the first end, and thermally connected to the heat generating body; a heat pipe comprising a heat receiving portion and a heat dissipating portion, wherein the heat receiving portion is thermally connected to the heat transferring member between the first end and the second end, and the heat dissipating portion is thermally connected to the heat dissipating member; and a pressing member comprising a pressing portion, a first arm, and a second arm, and presses the heat receiving portion against the heat transferring member along the heat pipe, wherein the pressing portion comprises a first region facing the first end and a second region facing the second end, the first arm extends from the first region and in a direction crossing the heat pipe, and the second arm extends from the second region, in a direction away from the first arm, and in the direction crossing the heat pipe.

The following embodiments and the modifications contain the common elements. Hence, the same reference numerals are used for the same elements, and repetitive explanations thereof are omitted. In the following, a direction perpendicularly away from a surface of a substrate is defined as upward.

As illustrated in FIG. 1, a substrate (circuit board) 3 is housed in a housing 2 of an electronic device 1 such as a television, a peripheral device for the television, or a personal computer.

A plurality of electronic components 4 is mounted on a front surface 3*a* or aback surface (not illustrated) of the substrate 3. Heat receiving blocks 6A, 6B (heat transferring members) are provided on elements 5A, 5B (heat generating bodies), respectively, among the electronic components 4. The elements 5A, 5B are, for example, a chipset, a central processing unit (CPU), or a multi-core CPU, which are highly integrated and generate large amount of heat. The heat receiving blocks 6A, 6B are pressed against the elements 5A, 5B by pressing members 7A, 7B attached to the substrate 3 and arranged above the heat receiving blocks 6A, 6B. The pressing members 7A, 7B are fixed to the substrate 3 by attachment tools such as screws 8. The pressing member 7A, 7B are elastically deformed when attached to the substrate 3, and the resultant elastic force acts downward onto the heat receiving blocks 6A, 6B, as the pressing force. Accordingly, the heat receiving blocks 6A, 6B are pressed against the elements 5A, 5B by the pressing force. In the embodiment, the pressing members 7A, 7B are attached to a stud 11 fixed to the substrate 3 (for example, see FIGS. 2, 4, and 5). The heat receiving blocks 6A, 6B can indirectly press the elements 5A, 5B through, for example, grease or a heat receiving sheet. In FIG. 1, illustration of wiring patterns are omitted.

The heat receiving blocks 6A, 6B are preferred to be formed of a material with high thermal conductivity (e.g., silver, copper, gold, aluminum, brass, iron, or alloy thereof). The pressing members 7A, 7B function as a plate spring, and preferred to be formed of a flat material with elasticity (e.g., spring steal or stainless steel). The pressing members 7A, 7B are further preferred to be formed of a material with high heat conductivity.

A heat dissipating member 10 having a number of fins and the like is provided inside the housing 2. The heat dissipating member 10 and the heat receiving blocks 6A, 6B are connected to each other by a heat pipe 9. The heat generated by the elements 5A, 5B is transferred to the heat dissipating member 10 through the heat receiving blocks 6A, 6B, a heat receiving portion 9*a* of the heat pipe 9, an intermittent portion of the heat pipe 9, and a heat dissipating portion 9*b* of the heat pipe 9. Then, the heat transferred to the heat dissipating member 10 is dissipated to the surrounding air therefrom. The heat dissipating member 10 is cooled by air blown by a fan (not illustrated) and the like.

A refrigerant that is evaporated by heating and condensed by cooling is contained in the heat pipe 9. The refrigerant provided inside the heat pipe 9 at a side of the heat receiving blocks 6A, 6B (i.e., inside the heat receiving portion) is evaporated and becomes gas when heated by the heat receiving blocks 6A, 6B. Then, the gas flows inside the heat pipe 9 towards the heat dissipating member 10. The refrigerant contained in the heat pipe 9 at a side of the heat dissipating member 10 (i.e., inside the heat dissipating portion 9*b*) is condensed and becomes liquid when cooled by the heat dissipating member 10. The liquefied refrigerant flows back inside the heat pipe 9 to the side of the heat receiving blocks 6A, 6B, by capillary action. As described above, the evaporation and the condensation of the refrigerant are repeated, and the refrigerant flows back and forth inside the heat pipe 9 between the heat receiving blocks 6A, 6B and the heat dissipating member 10. Accordingly, the heat from the elements 5A, 5B is transferred to the heat dissipating member 10 via the heat receiving blocks 6A, 6B and the heat pipe 9, and the transferred heat is dissipated from the heat dissipating member 10.

In the embodiment, as illustrated in FIG. 1, one of the elements 5A, 5B (hereinafter, referred to as second element 5B) with an amount of heat generation smaller than other one of the elements 5A, 5B (hereinafter, referred to as first element 5A) is arranged on the substrate 3 such that a distance between the second element 5B and the heat dissipating member 10 is greater than a distance between the first element 5A and the heat dissipating member 10. That is to say, the first element 5A with the amount of heat generation greater than that of the second element 5B is arranged closer to the heat dissipating member 10 than the second element 5B. As described above, by setting the length of the heat pipe 9 between the heat dissipating member 10 and one of the heat receiving blocks 6A, 6B (hereinafter, referred to as first heat receiving block 6A) arranged on the first element 5A to be shorter, the heat dissipation rate of the first element 5A having the large amount of heat generation can be increased.

Figure 2:
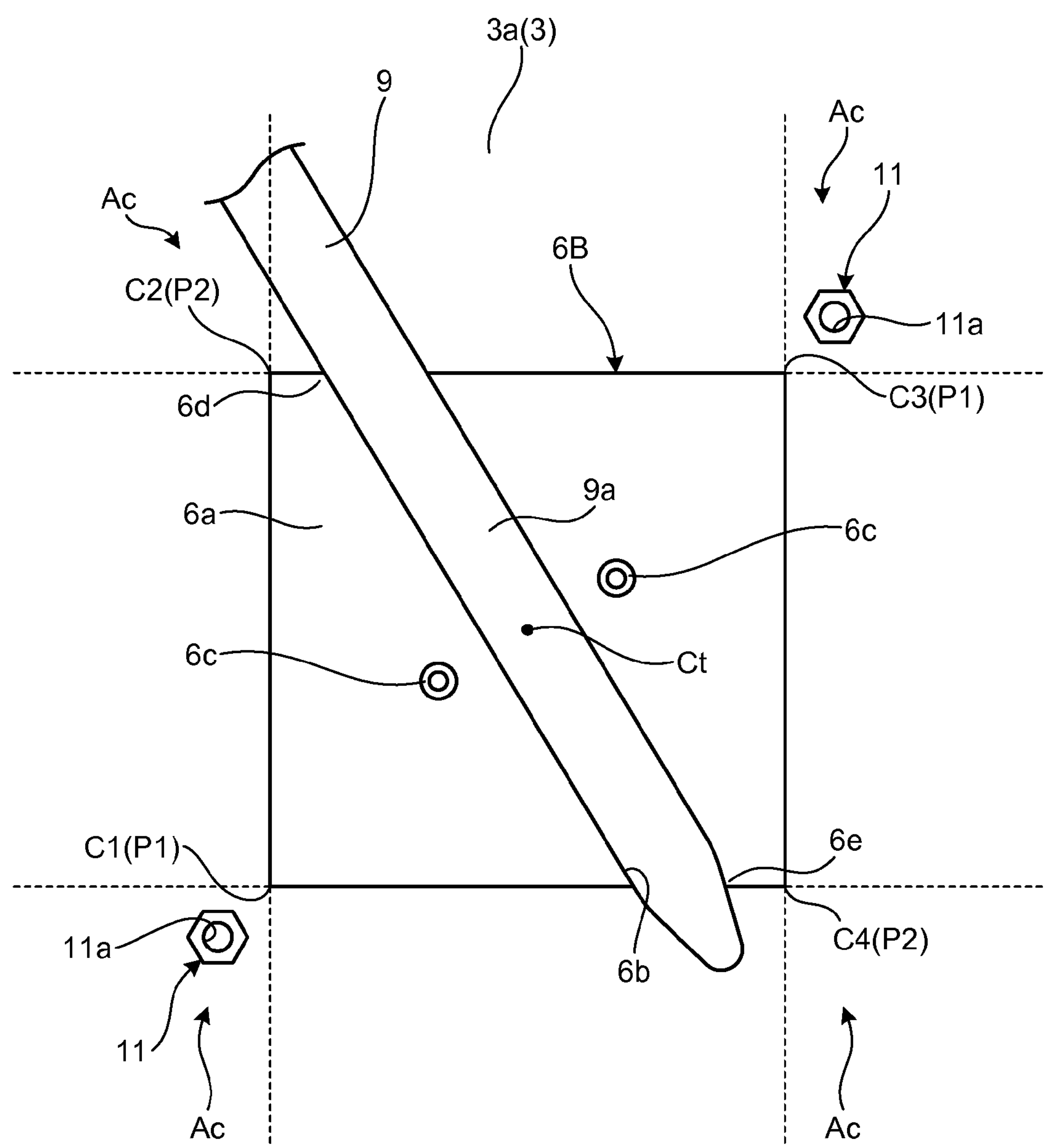
FIG. 2 is an exemplary plan view of a heat receiving block to which a housing portion housing a heat pipe is formed and of when a pressing member is detached, in the embodiment.
Figure 3:
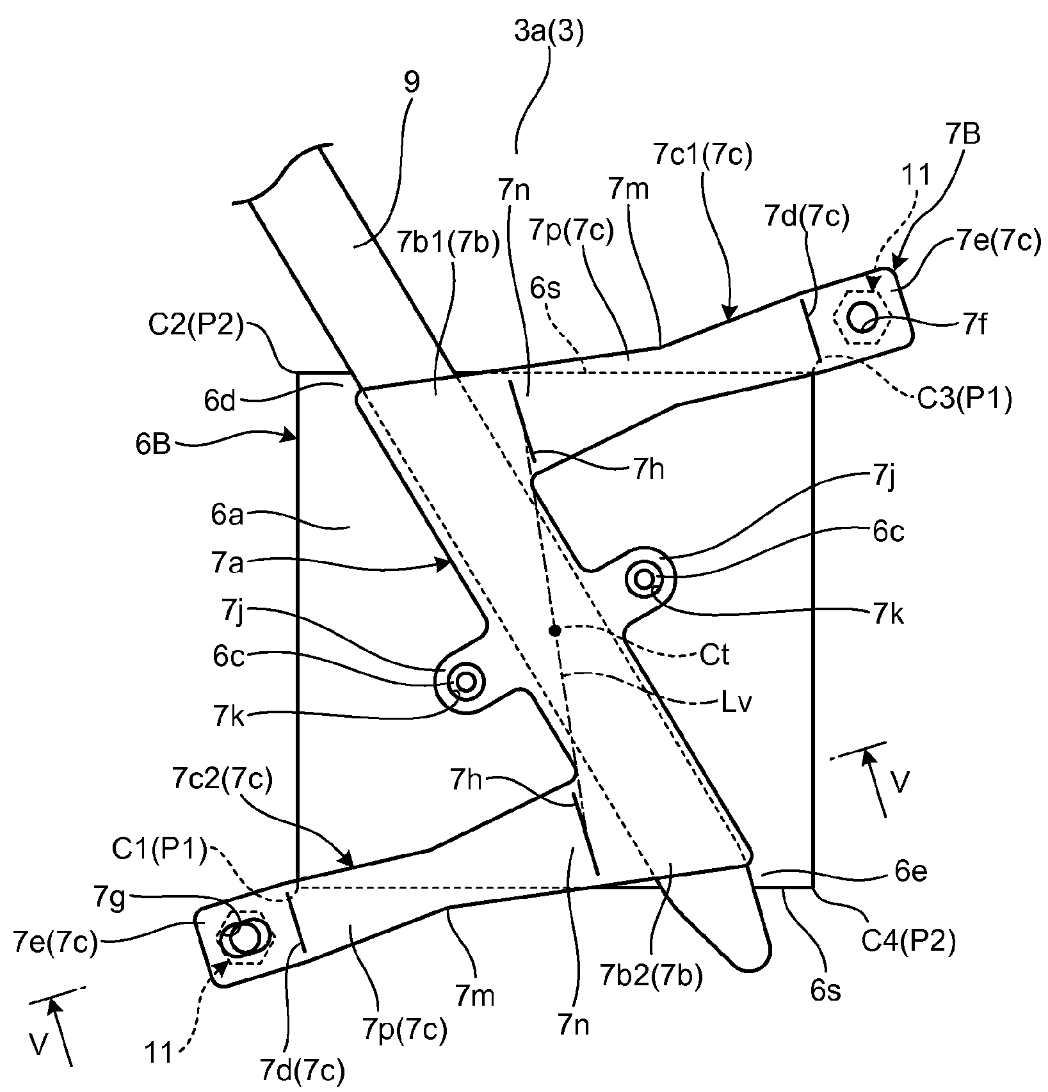
FIG. 3 is an exemplary plan view of a pressing structure for the heat receiving block of the substrate, where illustration of a screw for fixing the pressing member to the substrate is omitted, in the embodiment.
Figure 4:
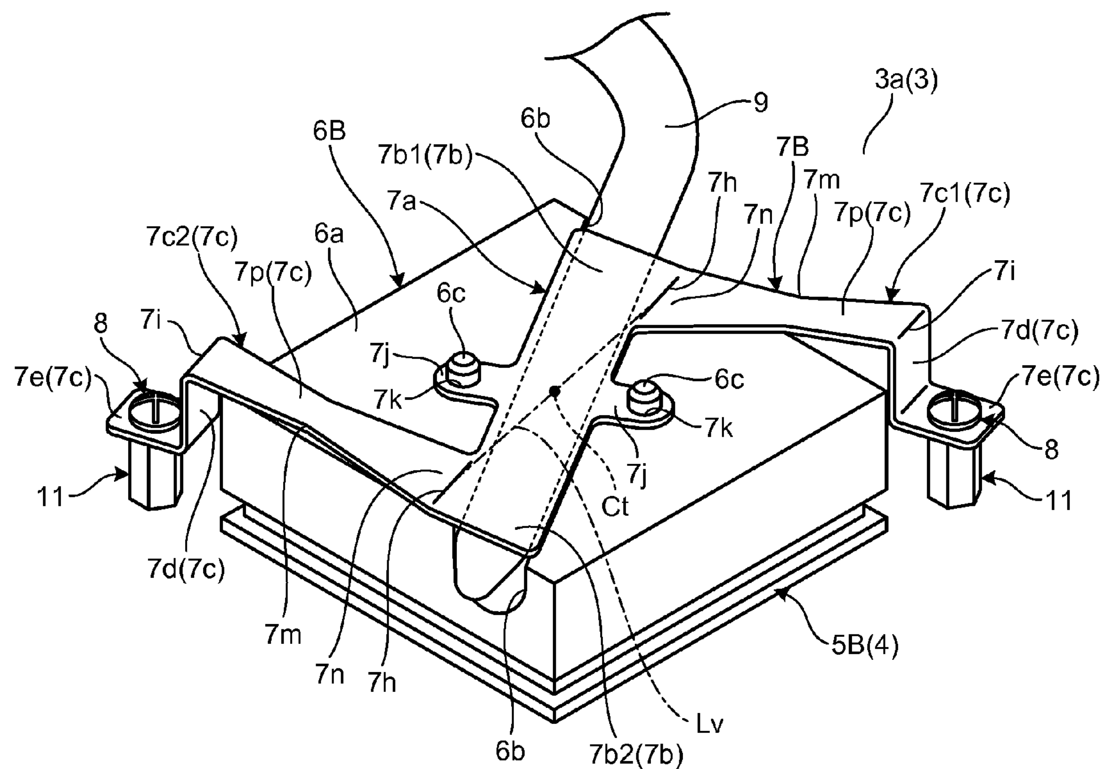
FIG. 4 is an exemplary perspective view of the pressing structure for the heat receiving block of the substrate in the embodiment.

As illustrated in FIG. 2, a groove-like depressed portion 6*b* is formed on an upper surface 6*a* of one of the heat receiving blocks 6A, 6B (hereinafter, referred to as second heat receiving block 6B) arranged on the second element 5B, and formed between a first end 6*d* of the second heat receiving block 6B and a second end 6*e* of the second heat receiving block 6B opposing the first end 6*d*. The heat pipe 9 is housed in the depressed portion 6*b*. The heat pipe 9 extends in a direction obliquely crossing one side 6*s* of four sides of the second heat receiving block 6B as seen in a planar view from above the second heat receiving block 6B. Consequently, as compared to the case when the heat pipe 9 extends in a direction orthogonally crossing the side 6*s*, larger section of the heat pipe 9 is held in contact with the second heat receiving block 6B, thereby the heat transferring efficiency from the second heat receiving block 6B to the heat pipe 9 can be improved. In the embodiment, the depressed portion 6*b* corresponds to the housing portion for the heat pipe 9. As illustrated in FIGS. 3 and 4, most of the opening of the depressed portion 6*b* is covered by the second pressing member 7B.

As illustrated in FIG. 1, in the embodiment, the first heat receiving block arranged on the first element 5A is pressed by the first pressing member 7A having X-shape as seen in the planar view, and the second heat receiving block 6B arranged on the second element 5B is pressed by the second pressing member 7B with reverse Z-shape (shape of reversed letter “Z”) as seen in the planar view. The first pressing member 7A with the X-shape can suppress the position dependency of the pressure acted by the heat receiving block 6A against the first element 5A, but on the other hand, a number of portions of the first pressing member 7A to be attached and fixed onto the substrate 3 is large, and occupies large area of the surface 3*a* of the substrate 3. As a result, for the X-shaped first pressing member 7A, it is difficult to efficiently layout the electronic component 4 or the wirings on the surface 3*a*. Thus, in the embodiment, the reverse Z-shaped second pressing member 7B is used for one of the first and the second heat receiving blocks 6A, 6B (the second heat receiving block 6B in the embodiment). Accordingly, in comparison to the case when the X-shaped pressing member is used, the number portions of the pressing member to be attached and fixed onto the substrate 3 can be decreased, and the area occupied by the pressing member on the surface 3A of the substrate 3 can be decreased. As a result, the layout of the electronic component 4 or the wirings on the surface 3*a* of the substrate 3 can efficiently be performed.

As illustrated in FIGS. 2 and 4, the second heat receiving block 6B arranged on the second element 5B is formed in a square shape as seen in a direction perpendicular to the surface 3*a* of the substrate 3 (planar view). Further, the second heat receiving block 6B is formed in a rectangular shape as seen in a direction parallel to the surface 3*a* of the substrate (side view), and in overall formed in a flat rectangular shape. A bottom surface (not illustrated) of the second heat receiving block 6B is in contact with an upper surface of the second element 5B, but the upper surface 6*a* of the second heat receiving block 6B is exposed.

Further, as illustrated in FIG. 2, the stud 11 for fixing the second pressing member 7B is provided on the surface 3*a* of the substrate 3 near each of a pair (P1) of corners C1, C3 of the second heat receiving block 6B opposing to each other. Normally, a wiring pattern (not illustrated) connected to a terminal (not illustrated) of the second element 5B is formed on the surface 3*a* of the substrate 3 in a region adjacent to each side (including the side 6*s*) of the second heat receiving block 6B. Hence, it is preferred to arrange the stud 11 in a region excluding the region adjacent to the each side but including a region aside of the corners C1 to C4 outward (in FIG. 2, the region Ac between the adjacent and orthogonal dotted lines). In the embodiment, the stud 11 is arranged near each of the corners C1, C3 (a pair (P1) of opposing corners C1, C3), and not near each of corners C2, C4 near which the heat pipe 9 is arranged (a pair (P2) of opposing corners C2, C4).

Figure 5:
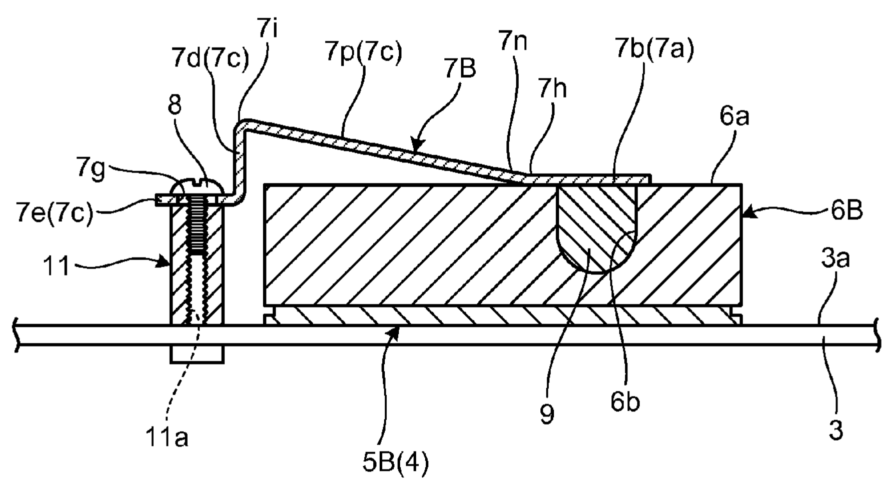
FIG. 5 is an exemplary cross sectional view of FIG. 3 taken along line V-V in the embodiment.

As illustrated in FIGS. 2 and 5, a female screw hole 11*a* opened upward is formed to the stud 11 in vertical direction. The second pressing member 7B is fixed onto the stud 11 by the screw 8 screwed into the female screw hole 11*a*. As illustrated in FIG. 4, the stud 11 is protruded from the surface 3*a* of the substrate 3. Consequently, an attachment portion 7*e* of the second pressing member 7B is provided above the surface 3*a* of the substrate 3.

As illustrated in FIGS. 2 and 4, two positioning pins 6*c*, 6*c* for positioning the second heat receiving block 6B and the second pressing member 7B are provided near a center Ct of the upper surface 6*a* of the second heat receiving block 6B, and protruded upward.

As illustrated in FIGS. 3 and 4, in the embodiment, the second pressing member 7B with the reverse Z-shape as seen from above the surface 3*a* of the substrate 3 (planer view) presses the second heat receiving block 6B against the second element 5B. The second pressing member 7B comprises a pressing portion 7*a* and two arms 7*c*, 7*c* (first arm 7*c*1, second arm 7*c*2). The pressing portion 7*a* is connected to the two arms 7*c*, 7*c* to form the reverse Z-shape as seen in the planar view.

As illustrated in FIGS. 4 and 5, in the embodiment, one longitudinal ends 7*n*, 7*n* (hereinafter referred to as first longitudinal ends) of the arms 7*c*, 7*c* are connected to longitudinal ends 7*b*, 7*b* (first area 7*b*1, second area 7*b*2) of the pressing portion 7*a* formed in band-shape, respectively. The attachment portions 7*e* which are other longitudinal ends (hereinafter, referred to as second longitudinal ends) of the arms 7*c* are fixed to the substrate 3. The arm 7*c* comprises an oblique portion 7*p* extended obliquely upwards from a line-shaped bent portion 7*h* defining a boundary with respect to the pressing portion 7*a* (end portion 7*b*), a vertical wall portion 7*d* formed by bending the arm 7*c* downward at a bent portion 7*i* provided at a proximal end side of the oblique portion 7*p*, and the attachment portion 7*e* formed by bending the arm 7*c* in a direction along the surface 3*a* of the substrate 3 at the lower end of the vertical wall portion 7*d*.

As illustrated in FIG. 3, a protruding portion 7*j* protruding towards a width direction of the pressing portion 7*a* is formed at an intermittent portion of the pressing portion 7*a* in the elongated direction of the pressing portion 7*a*. Further, a through hole 7*k* through which the positioning pin 6*c* of the second heat receiving block 6B is inserted is formed for the protruding portion 7*j*. Still further, a narrow width portion 7*m* is provided to the intermittent portion of the arm 7*c*. The magnitude of the stress caused in the arm 7*c* is adjusted by the narrow width portion 7*m*.

As illustrated in FIG. 3, through holes 7*f*, 7*g* are formed in the attachment portion 7*e*. The screw 8 is inserted through the through holes 7*f*, 7*g*, and screwed into the female screw hole 11*a* of the stud 11. As a result, the second pressing member 7B is attached onto the stud 11 that is fixed to the substrate 3. One of the through holes 7*f*, 7*g* (through hole 7*f* in the embodiment) is formed in a circular shape, and other one (through hole 7*g* in the embodiment) is formed in a slotted hole shape.

In the embodiment, when the second pressing member 7B is attached to the second heat receiving block 6B, the arms 7*c*, 7*c* are elastically bent downward as compared to when the second pressing member 7B is in a free state. That is to say, the reaction force of the two arms 7*c*, 7*c* causes a pressing force of the pressing portion 7*a* downward toward the second heat receiving block 6B.

In the embodiment, as illustrated in FIGS. 3 and 4, the pressing portion 7*a* is connected to the two arms 7*c*, 7*c* in a bent shape as seen in the planar view from above the surface 3*a* of the substrate 3. That is to say, in the embodiment, the pressing portion 7*a* and the two arms 7*c*, 7*c* are connected to each other in a reverse Z-shape as seen in the planar view. In particular, the two arms 7*c*, 7*c* extend in a direction crossing an imaginary line LV and in a direction away from each other, from the two bent portions 7*h*, 7*h* provided as connecting portions with respect to the pressing portion 7*a*. Here, the imaginary line Lv connects between a center of the bent portion 7*h* of the first arm 7*c*1 and a center of the bent portion 7*h* of the second arm 7*c*2. As mentioned above, in the embodiment, since the pressing portion 7*a* and the two arms 7*c*, 7*c* are connected to form the bent shape on the second heat receiving block 6B as seen in the planar view, the pressing portion 7*a* can be formed even longer. Thus, the position dependency of the pressure acted by the second heat receiving block 6B against the second element 5B can be suppressed. Further, it becomes easier to form the two arms 7*c*, 7*c* with a desired length, so that the increase in the stress caused locally for the pressing member 7B (especially the arm 7*c*) can be suppressed. Thus, the plastic deformation of the second pressing member 7B can be suppressed. Therefore, the increase in the position dependency of the pressure acted by the second heat receiving block 6B against the second element 5B due to the plastic deformation of the pressing member 7B can be suppressed.

In the embodiment, as illustrated in FIG. 3, the second pressing member 7B is formed so that the second pressing member 7B is point symmetric with respect to a center Ct of the second heat receiving block 6B, as seen in the planar view. Thus, the difference in pressing force generated by an arm 7*c*1 side and by an arm 7*c*2 side can easily be suppressed, and the position dependency of the pressure acted by the second heat receiving block 6B against the second element 5B can further be decreased.

In the embodiment, as illustrated in FIG. 3, the pressing portion 7*a* extends along in a direction obliquely crossing one side 6*s* of the second heat receiving block 6B as seen in the planar view. Thus, in comparison to a case when the pressing portion 7*a* is provided in a direction parallel to or at a right angle with respect to the side 6*s*, the pressing portion 7*a* can be formed longer (wider). As a result, the position dependency of the pressure acted by the second heat receiving block 6B against the second element 5B can further be decreased.

Particularly, in the embodiment, as illustrated in FIG. 3, a longitudinal end 7*b* on one side (e.g., upper left hand side in FIG. 3) of the pressing portion 7*a* formed in the band shape is arranged at a position nearer to one of the four corners C1 to C4 (e.g., C2 of FIG. 3) than the center Ct of the second heat receiving block 6B as seen in the planar view, and a longitudinal end 7*b* on other side (lower right hand side in FIG. 3) of the pressing portion 7*a* is arranged at a position nearer to a corner (e.g., C4 of FIG. 3) opposing the corner (e.g., C2 of FIG. 3) near the longitudinal end 7*b* arranged at the position nearer to the one of the corners C1 to C4 than the center Ct.

Here, the two opposing corners forms the pair P2. Accordingly, the pressing portion 7*a* formed in the band shape can be arranged near a diagonal line of the rectangular second heat receiving block 6B as seen in the planar view. Therefore, the pressing portion 7*a* can be formed even longer (wider), and the position dependency of the pressure acted by the second heat receiving block 6B against the second element 5B can further be decreased.

In the embodiment, as illustrated in FIG. 3, the attachment portions 7*e*, 7*e* are arranged at positions near two corners C1, C3 (corners C1, C3 forming the opposing pair P1) other than the two corners C2, C4 (corners C2, C4 forming the opposing pair P2) arranged near the both ends 7*b*, 7*b* of the pressing portion 7*a*. Thus, a distance between the bent portion 7*h* and the attachment portion 7*e* can be increased, and the two arms 7*c*1, 7*c*2 can be formed to have a desired length. Therefore, the reaction force of the pressing member 7B can be suppressed from being increased locally, and the plastic deformation of the pressing member 7B can be suppressed.

In the embodiment, as illustrated in FIGS. 2, 4, and 5, the depressed portion 6*b* provided as a housing portion housing the heat pipe 9 extending along the surface 3*a* of the substrate 3 is formed on the second heat receiving block 6B. The pressing portion 7*a* is arranged above the heat pipe 9 housed in the depressed portion 6*b* and along the heat pipe 9. In the aforementioned structure, when the second element 5B, the second heat receiving block 6B, and the pressing member 7B are attached to the substrate 3, it might be the case that the force is acted by the heat pipe 9 against the heat receiving block 6B in a direction moving up the second heat receiving block 6B, due to the dimensional error or the layout. However, in the embodiment, since the pressing portion 7*a* extends along the heat pipe 9, and the arms 7*c*1, 7*c*2 are formed on the longitudinal ends 7*b*, 7*b* of the pressing portion 7*a*, the force acted by the heat pipe 9 against the heat receiving block 6B can be effectively received by the pressing member 7B at an input side of the force and at the wider area. Therefore, it becomes easier to suppress the second heat receiving block 6B from being spaced apart from the second element 5B. Beside, for a structure having the depressed portion 6*b* not being opened upward but instead having the heat pipe 9 embedded inside the second heat receiving block 6B, it also becomes easier to suppress the second heat receiving block 6B from being spaced apart from the second element 5B.

In the embodiment, the depressed portion 6*b* formed on the second heat receiving block 6B is opened upward, and the opened section is covered by the pressing member 7B from thereabove. By forming the depressed portion 6*b* to be opened upward, in comparison to the case when a through hole (not illustrated) is formed inside the second heat receiving block 6B as the housing portion of the heat pipe 9 and the heat pipe 9 is inserted into the through hole, the thickness of the second heat receiving block 6B can be thinned down. Thus, the overall thickness of the substrate 3 on which the electronic component 4, the first element 5A, or the second element 5B are mounted can be thinned down, and the size of the electronic device 1 can be decreased. Further, by covering the opened section of the depressed portion 6*b* by the pressing member 7B and have the pressing member 7B work as the heat transmitting member, in comparison to the case when the opened section is not covered by the pressing member 7B, the heat transmission efficiency from the second heat receiving block 6B to the heat pipe 9 can be increased.

In the above embodiment, the pressing member has the reversed Z-shape as seen in the planar view. However, the pressing member may have Z-shape to obtain the same aforementioned effect.

Figure 6:
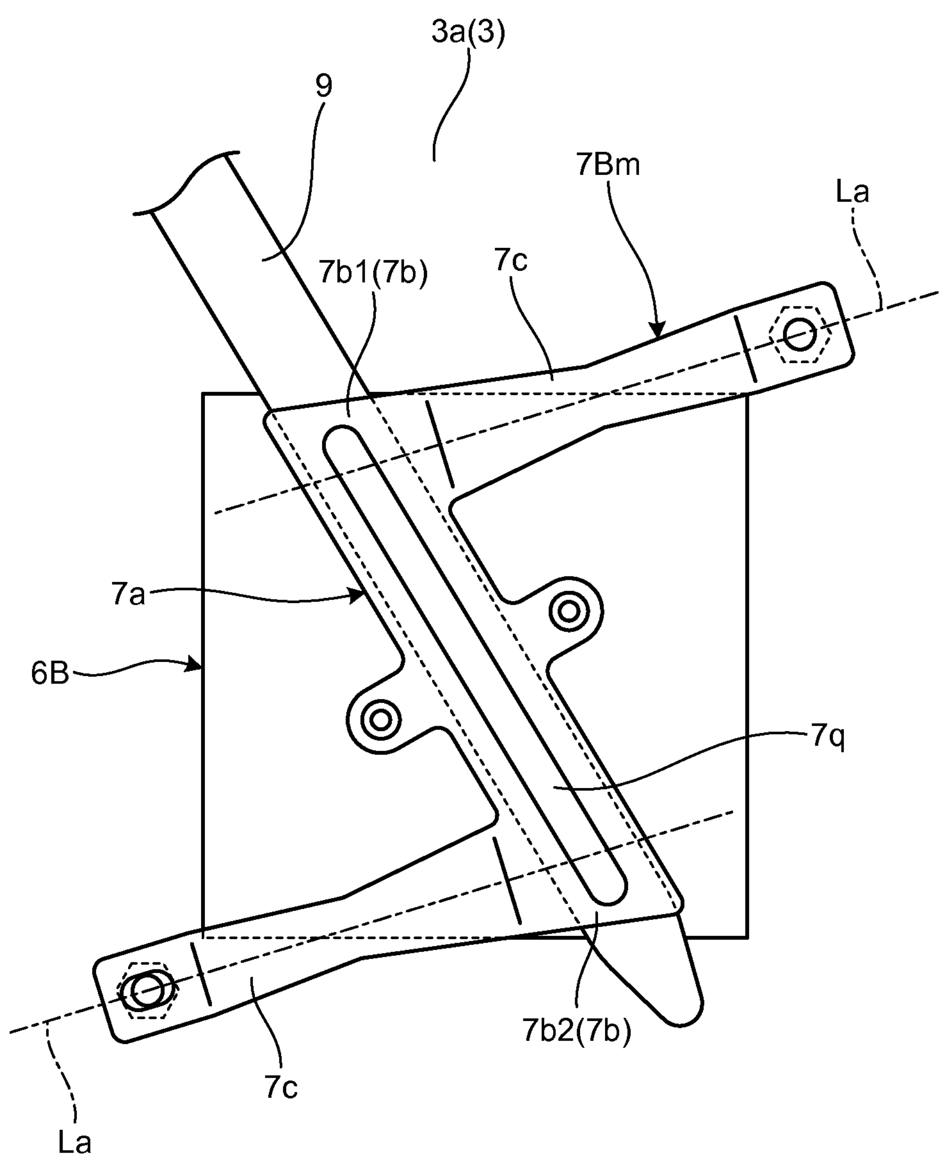
FIG. 6 is an exemplary plan view of a pressing structure for a heat receiving block of a substrate according to a modification of the embodiment.

In a pressing member 7Bm according to a modification illustrated in FIG. 6, a bead 7*q* (protrusion bulging upward) is formed on the pressing portion 7*a* so as to extend along the elongated direction of the pressing portion 7*a*. As a result, rigidity of the pressing portion 7*a* can be increased. Accordingly, the position dependency of the pressure acted by the pressing portion 7*a* against the second heat receiving block 6B due to the position of the pressing portion 7*a* can be suppressed, and the position dependency of the pressure acted by the second heat receiving block 6B against the second element 5B can be decreased. Further, according to the aforementioned structure, as illustrated in FIG. 6, it is preferred to form the bead 7*q* so that the bead 7*q* extends over a first center line La of the first arm 7*c*, and extends to and over a second center line La of the second arm 7*c* opposing to the first center line La with respect to the center Ct. Consequently, the rigidity of the connecting portion between the pressing portion 7*a* and the arm 7*c* is increased so that the position dependency of the pressure acted by the pressing portion 7*a* against the second heat receiving block 6B due to the position of the pressing portion 7*a* can further be suppressed.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:

a body;

a radiator housed in the body;

a circuit substrate housed in the body, a heat generator being mounted to the circuit substrate;

a heat transfer portion comprising a first end and a second end positioned opposite the first end, and thermally connected to the heat generator;

a heat pipe comprising a heat receiving portion and a radiator portion, wherein:

the heat receiving portion is thermally connected to the heat transfer portion between the first end and the second end, and the radiator portion is thermally connected to the radiator; and a pressing member comprising a pressing portion, a first arm, and a second arm, and located along the heat pipe, wherein:

the pressing portion comprises a first region facing the first end and a second region facing the second end, and is configured to press a region of the heat receiving portion corresponding to a region between the first end and the second end of the heat transfer portion, the first arm extends from the first region in a direction crossing the heat pipe, and the second arm extends from the second region in a direction away from the first arm and crossing the heat pipe, wherein the first arm, the second arm, and the pressing portion are connected to each other in a Z-shape or a reverse Z-shape in the plan view.

2. The electronic device of claim 1, wherein the heat transfer portion is formed in rectangular in a plan view, and the pressing portion obliquely crosses a side of the heat transfer portion in the plan view.

3. The electronic device of claim 2, wherein the first region is located at a position closer to a first corner of four corners of the heat transfer portion than a center of the heat transfer portion in the plan view, and the second region is located at a position close to a second corner of the four corners diagonal to the first corner closer to the first region than to the center in the plan view.

4. The electronic device of claim 3, wherein an end of the first arm on opposite side of the pressing portion is located at a position closer to a third corner of the four corners than the first corner, and an end of the second arm on opposite side of the pressing portion is located at a position closer to a fourth corner of the four corners than the second corner.

5. The electronic device of claim 1, wherein the pressing portion is provided with a bead that extends longitudinally along the pressing portion.

6. The electronic device of claim 1, wherein the heat transfer portion is rectangular in a plan view, the pressing portion obliquely crosses a side of the heat transfer portion in the plan view, the first region is located at a position closer to a first corner of four corners of the heat transfer portion than a center in the plan view, and the second region is located at a position closer to a second corner of the four corners than the center in the plan view, the second corner being diagonal to the first corner.

7. The electronic device of claim 6, wherein an end of the first arm on opposite side of the pressing portion is located at a position closer to a third corner of the four corners than the first corner, and an end of the second arm on opposite side of the pressing portion is located at a position closer to a fourth corner of the four corners than the second corner.

8. The electronic device of claim 1, further comprising a depressed portion formed on an upper surface of the heat transfer portion, wherein:

the depressed portion is configured to house a heat pipe extending along the circuit substrate, and to be opened upward, and the pressing portion extends along the heat pipe and is configured to cover the depressed portion from the upper side.

9. An electronic device, comprising:

a body;

a radiator housed in the body;

a circuit substrate housed in the body;

a first device as a heat generator mounted to the circuit substrate;

a second device as a heat generator mounted to the circuit substrate, and located more distant from the radiator than the first device is;

a heat transfer portion comprising a first end and a second end opposite the first end, and thermally connected to the second device;

a heat pipe comprising a heat receiving portion and a radiator portion, wherein:

the heat receiving portion is thermally connected to the heat transfer portion between the first end and the second end, and the radiator portion is thermally connected to the radiator; and a pressing member comprising a pressing portion, a first arm, and a second arm, and located along the heat pipe, wherein:

the pressing portion comprises a first region facing the first end and a second region facing the second end, and is configured to press a region of the heat receiving portion corresponding to a region between the first end and the second end of the heat transfer portion, the first arm extends from the first region in a direction crossing the heat pipe, and the second arm extends from the second region in a direction away from the first arm and crossing the heat pipe, wherein the heat transfer portion is formed in rectangular in a plan view, wherein the pressing portion obliquely crosses a side of the heat transfer portion in the plan view, and wherein the first arm, the second arm, and the pressing portion are connected to each other in a Z-shape or a reverse Z-shape in the plan view.

10. The electronic device of claim 9, wherein:

the heat transfer portion is formed in rectangular in plan view, and the pressing portion obliquely crosses a side of the heat transfer portion in the plan view.

11. The electronic device of claim 10, wherein:

the first region is located at a position closer to a first corner of four corners of the heat transfer portion than a center of the heat transfer portion in the plan view, and the second region is located at a position close to a second corner of the four corners diagonal to the first corner closer to the first region than to the center in the plan view.

12. The electronic device of claim 11, wherein:

an end of the first arm on opposite side of the pressing portion is located at a position closer to a third corner of the four corners than the first corner, and an end of the second arm on opposite side of the pressing portion is located at a position closer to a fourth corner of the four corners than the second corner.

13. The electronic device of claim 9, wherein the pressing portion is provided with a bead that extends longitudinally along the pressing portion.

14. The electronic device of claim 9, wherein:

the heat transfer portion is rectangular in plan view, the pressing portion obliquely crosses a side of the heat transfer portion in the plan view, the first region is located at a position closer to a first corner of four corners of the heat transfer potion than a center in the plan view, and the second region is located at a position closer to a second corner of the four corners than the center in the plan view, the second corner being diagonal to the first corner.

15. The electronic device of claim 14, wherein an end of the first arm on opposite side of the pressing portion is located at a position closer to a third corner of the four corners than the first corner, and an end of the second arm on opposite side of the pressing portion is located at a position closer to a fourth corner of the four corners than the second corner.

16. The electronic device of claim 9, further comprising a depressed portion formed on an upper surface of the heat transfer portion, wherein:

the depressed portion is configured to house a heat pipe extending along the circuit substrate, and to be opened upward, and the pressing portion extends along the heat pipe and is configured to cover the depressed portion from the upper side.

17. An electronic device, comprising:

a body;

a circuit substrate housed in the body;

a heat generator mounted to the circuit substrate, comprising a first end and a second end different from the first end;

a heat pipe comprising:

a heat receiving portion thermally connected to the heat generator between the first end and the second end, and a radiator portion configured to radiate heat received by the heat receiving portion; and a pressing member comprising:

a pressing portion configured to press a region of the heat receiving portion over between the first end and the second end toward a side of the heat generator, a first arm extending from one end of the region in a direction crossing the heat pipe, and a second arm extending from another end of the region in a direction away from the first arm and crossing the heat pipe, wherein the first arm, the second arm, and the pressing portion are connected to each other in a Z-shape or a reverse Z-shape in the plan view.

18. The electronic device of claim 17, wherein the pressing portion is provided with a bead that extends longitudinally along the pressing portion.

* * * * *